(12) United States Patent
Peretz et al.

(10) Patent No.: US 9,891,593 B2
(45) Date of Patent: Feb. 13, 2018

(54) FULLY-DIGITAL FULLY-SYNTHESIZABLE DELAY-LINE ANALOG TO DIGITAL CONVERTER

(71) Applicant: B. G. NEGEV TECHNOLOGIES AND APPLICATIONS LTD., AT BEN GURION UNIVERSITY, Beer Sheva (IL)

(72) Inventors: Mor Mordechai Peretz, Lehavim (IL); Yevgeny Bezdenezhnykh, Beer Sheva (IL)

(73) Assignee: B.G. Negev Technologies and Applications Ltd., at Ben-Gurion University, Beer Sheva (IL)

( * ) Notice: Subject to any disclaimer, the term of this patent is extended or adjusted under 35 U.S.C. 154(b) by 0 days.

(21) Appl. No.: 15/311,550

(22) PCT Filed: May 17, 2015

(86) PCT No.: PCT/IL2015/050521
§ 371 (c)(1),
(2) Date: Nov. 16, 2016

(87) PCT Pub. No.: WO2015/177786
PCT Pub. Date: Nov. 26, 2015

(65) Prior Publication Data
US 2017/0123381 A1 May 4, 2017

Related U.S. Application Data

(60) Provisional application No. 61/994,898, filed on May 18, 2014.

(51) Int. Cl.
*H03M 1/50* (2006.01)
*G04F 10/00* (2006.01)

(52) U.S. Cl.
CPC .................. *G04F 10/005* (2013.01)

(58) Field of Classification Search
CPC .......... G04F 10/005; H03M 1/50; H03M 1/60
(Continued)

(56) References Cited

U.S. PATENT DOCUMENTS 5,052,389 A 10/1991 Henry
5,097,262 A 3/1992 Seki et al.
(Continued)

FOREIGN PATENT DOCUMENTS

CN 101800552 A 8/2010
CN 102882527 A 1/2013
(Continued)

OTHER PUBLICATIONS

Highly-Linear Voltage-to-time converter (VTC) Circuit for Time-Based Analog-to-Digital Converters (T-ADCs), Hassan Mostafa & Yehea I Ismail, Dec. 11, 2013 (4 pages).
(Continued)

*Primary Examiner* — Khai M Nguyen
(74) *Attorney, Agent, or Firm* — Roach Brown McCarthy & Gruber, P.C.; Kevin D. McCarthy (57) ABSTRACT

The present invention relates to the realization of an ADC by using a one shot time cell as an analog-to-time converter and a time-to-digital converter. The present invention relates in general, to the design and Integrated Circuit (IC) implementation of a fully-digital fully-synthesizable, delay-line analog-to-digital converter (DL-ADC). The present invention is specifically relevant for power management applications where the silicon area of the controller is of key importance. The design of the ADC is based on the approach of delay cells string to reduce design complexity and the resultant of the silicon area.

10 Claims, 10 Drawing Sheets

(58) Field of Classification Search
USPC .......................................... 341/155, 157, 166
See application file for complete search history.

(56) References Cited

U.S. PATENT DOCUMENTS

| | | | |
|---|---|---|---|
| 8,325,076 B2 * | 12/2012 | Yousif ................... | G04F 10/005 |
| | | | 341/155 |
| 8,890,741 B2 * | 11/2014 | Dosho ................. | H03M 1/1215 |
| | | | 341/155 |
| 2012/0176262 A1 | 7/2012 | Chen et al. | |
| 2014/0146234 A1 | 5/2014 | Chou et al. | |

FOREIGN PATENT DOCUMENTS

| | | |
|---|---|---|
| EP | 0184585 A1 | 6/1986 |
| GB | 1262447 A | 2/1972 |

OTHER PUBLICATIONS

Time-Based Analog to Digital Converters, Univ of Michigan, Dec. 31, 2009 (118 pages).
International Search Report for PCT/IL2015/050521, dated Aug. 30, 2015; 4 pages.
Written Opinion of the International Searching Authority for PCT/IL2015/050521, dated Aug. 30, 2015; 6 pages.
European Search Report regarding counterpart foreign application—EP application No. 15796144.2—dated Dec. 18, 2017, 9 pages.

* cited by examiner

COMPARISON OF THE IMPLEMENTED DL-ADCs

| Architecture | Compressed | Uncompressed |
|---|---|---|
| Technology | ts18pm | ts18pm |
| Sampling rate | 4Mbps | 2Mbps |
| Input range | 2v-5v | 2v-5v |
| Resolution | 10 bit | 10 bit |
| Supply voltage | 5v | 5v |
| Delay elements | 127 | 1023 |
| Wallace Tree output register | 7-bit | 10-bit |
| Total logic elements | 209 | 1066 |
| Silicon area | 0.05 mm$^2$ | 0.38mm$^2$ |

FULLY-DIGITAL FULLY-SYNTHESIZABLE DELAY-LINE ANALOG TO DIGITAL CONVERTER

FIELD OF INVENTION

The invention is in the field of analog to digital converters (ADC).

BACKROUND OF THE INVENTION

Analog to Digital Converters (ADC) are well-known circuitries and widely used in many electronic devices. They convert an analog input voltage into a digital output signal as a number of bits.

Digital controller implementation for many modern systems has gain popularity in recent years. A key block in the realization of a digital controller is the analog-to-digital converter (ADC), in which its accuracy, resolution, and speed affects the performance of the system. When the ADC is used in the feedback path, as a part of a controller or regulator, the stability may be affected as well. The use of a conventional high-speed, high-resolution ADC comes at the cost of circuit complexity and silicone (SI) area, requiring custom precision-analog components. Recently introduced delay-line ADCs (DL-ADCs) have become an attractive alternative to conventional ADCs. These offer a cost-effective solution by facilitating the module design process through digital implementation and can be implemented on a smaller SI area.

A DL-ADC can be categorized by two approaches, custom-design and standard-cells based. The former comprises specially-tailored delay units which require significant experience in custom design process. The latter, though limited by the vendor's standard-cells' constraints, can be implemented through a digital design flow, making it an attractive approach.

To realize a DL-ADC using only standard-cells, one can use the sensed analog input as the delay cells' supply voltage. The propagation along the delay line is affected by the cells' supply and serves as a measure for the analog voltage-level. Although simpler than using custom cells, in order to avoid very limited conversion range, this approach still requires advanced design. Furthermore, multiple supplies are required to accommodate the conversion. The present invention presents an all-digital standard-cell realization of a DL-ADC with a single supply domain and can therefore be designed using a generic digital flow procedure. The architecture is based on a two-step conversion flow. Initial analog-to-time conversion is achieved by means of a one-shot timer module. It is followed by time-to-digital conversion, accomplished using an advanced ring oscillator module realization, which enables high resolution conversion using a string of only 127 delay cells, regardless of the resolution requirement.

It is therefore a purpose of the present invention to present a realization of a DL-ADC using only standard-cells, which is based on two-step conversion flow. Initial analog-to-time conversion, which is achieved by means of a one-shot timer module, and a time-to-digital conversion, accomplished using an advanced ring oscillator module realization.

SUMMARY OF THE INVENTION

In one aspect the present invention is an analog to digital converter which comprises:

an analog to time converter being a one shot time cell, which receives as an input a pulse trigger signal and outputs a pulse signal Vx, wherein the duration of Vx is proportional to the voltage levels and/or to the components in said one shot time cell, that determine the time response of said one shot time cell; and a time to digital converter, which receives said output pulse signal Vx as an input and outputs a digital representation of the duration of said Vx signal.

In an embodiment of the invention, the one shot time cell consists of one input which connects to a NOR gate and is used to trigger a timed pulse Vx, and a second input which receives an analog signal to be used as a sampled-voltage for an R-C timing cell, such that the outputted pulse duration, which depends on said sampled voltage, produces a time representation of the analog signal.

In an embodiment of the invention, $$T_{pulse} = RC \ln\left(\frac{V_{DD}}{V_{sample} - V_{threshold}}\right)$$

where $V_{DD}$ is the supply voltage of the digital cells, $V_{threshold}$ is the logic gate threshold voltage, and $V_{sample}$ is the value of the sampled voltage at a sampling point.

In an embodiment of the invention, the relationship between the sampled voltage and the digital output is linear by the addition of pre, or post conversion linearization unit.

In an embodiment of the invention, all the components of said converter are digital.

In an embodiment of the invention, the analog link that connects to said sampled voltage is a resistor.

In an embodiment of the invention, a start of count is the rising edge of said Vx pulse and stop of count is the falling edge of said Vx pulse.

In an embodiment of the invention, a sampled voltage in a sample point, is generated with a sample-and-hold unit.

In another aspect the invention is an analog to digital converter that operates as a window-ADC which comprises:

an analog to time converter being a one shot time cell, which receives as an input a pulse trigger signal and outputs a pulse signal, the duration of which is proportional to the voltage levels and/or to the components in said one shot time cell, that determine the time response of said one shot time cell;

a time to digital converter, which receives as an input:
said output pulse signal as a variable signal; and
a constant reference signal;

and comprises a logic component for performing a logic operation between said variable signal, and said constant reference signal, to generate a resulting time representation pulse Vt with a duration which equals the time difference between said constant reference signal and said variable signal;

and wherein said time to digital converter outputs a digital signal that represents said duration.

In an embodiment of the invention, the reference signal is internally generated.

In an embodiment of the invention, the reference signal is generated by an additional one-shot timer with a constant Voltage at a sampling point.

In an embodiment of the invention, a start of count is the rising edge of the said Vt pulse and stop of count is the falling edge of said Vt pulse.

DETAILED DESCRIPTION OF THE EMBODIMENTS OF THE INVENTION

The present invention relates to the realization of an ADC by using a one shot time cell as an analog-to-time converter and a time-to-digital converter. The present invention relates in general, to the design and Integrated Circuit (IC) implementation of a fully-digital fully-synthesizable, delay-line analog-to-digital converter (DL-ADC). The present invention is specifically relevant for power management applications where the silicon area of the controller is of key importance. The design of the ADC is based on the approach of delay cells string to reduce design complexity and the resultant of the silicon area. A unique advantage of the present invention ADC architecture and the design process is that it is entirely based on standard digital cells out of a vendor's library. Namely, neither custom nor analog design is required, making the concept attractive in terms of performance, scalability to other implementation platforms, design complexity and cost. Furthermore, thanks to the unique selection of the analog to digital link, the ADC can well perform without a sample-and-hold unit. In the present invention, two implementation options to the DL-ADC architecture are presented, and both are demonstrated and verified with post-layout results on a Tower Jazz 0.18 μm power management (TS18PM) platform. The total silicon area that is required for the implementation of the DL-ADC of the present invention sums at 0.05 mm², which confirms the area saving attribute of the concept and design procedure.

Figure 1:
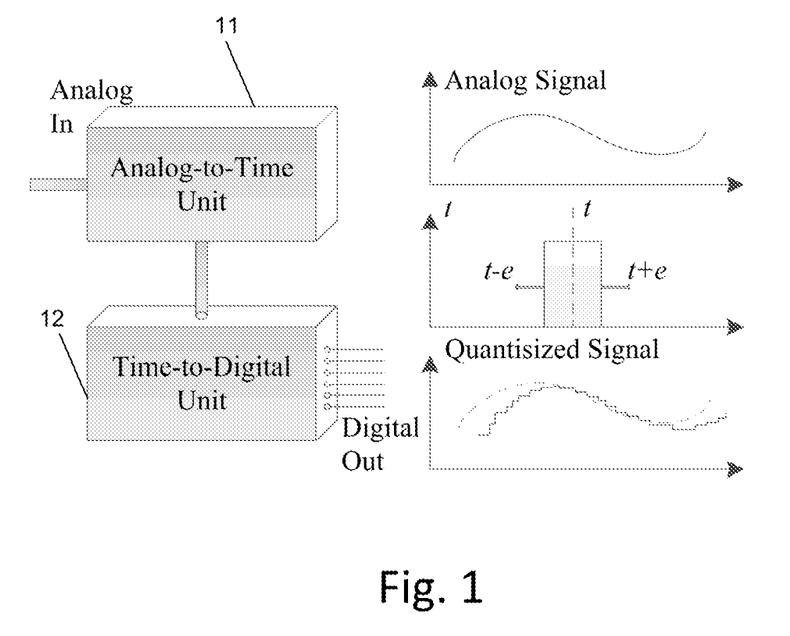
FIG. 1 schematically shows the Conversion Method of the Analog-to-Time-to-Digital Converter according to an embodiment of the invention.

The DL-ADC module of the present invention comprises two sequential sub-modules for the full analog-to-digital (A/D) conversion, as demonstrated in FIG. 1. The first sub-module 11, is an analog-to-time (A/T) converter (ATC) which receives an analog input signal and outputs a logic-level signal which varies its pulse length as a function of amplitude of the analog input. The second sub-module 12, is a time-to-digital (T/D) converter (TDC) which receives the ATC's signal and quantizes its length to produce a binary representation.

In an embodiment of the present invention the analog to time converter is a one shot time cell. The one shot time cell receives as an input a pulse trigger signal and outputs a pulse signal Vx, wherein the length of Vx is proportional to the voltage levels and/or to the components of said one shot time cell (i.e. resistors, capacitors etc.).

Figure 2:
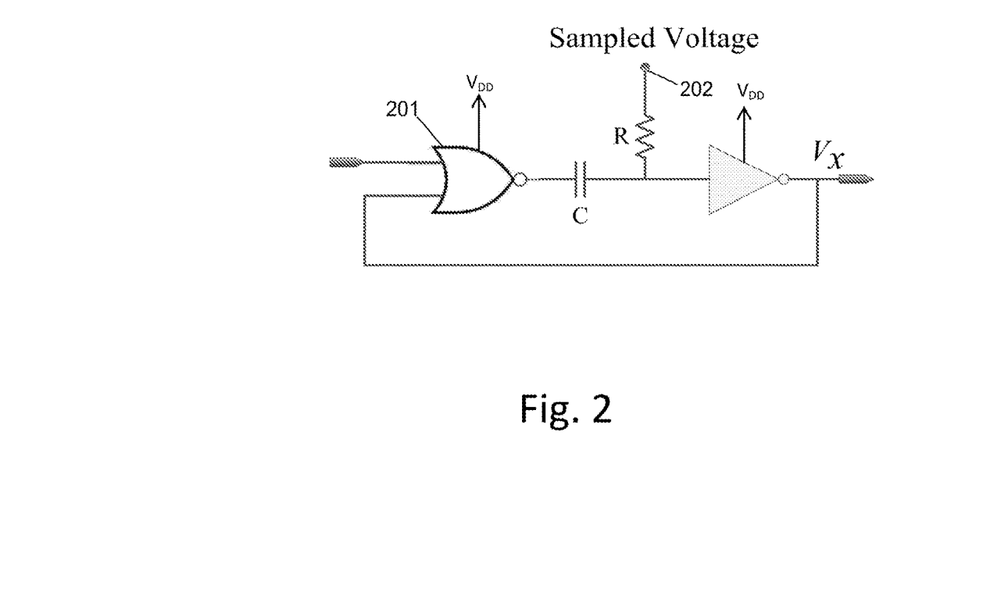
FIG. 2 schematically shows a One Shot time cell according to an embodiment of the invention.
Figure 8:
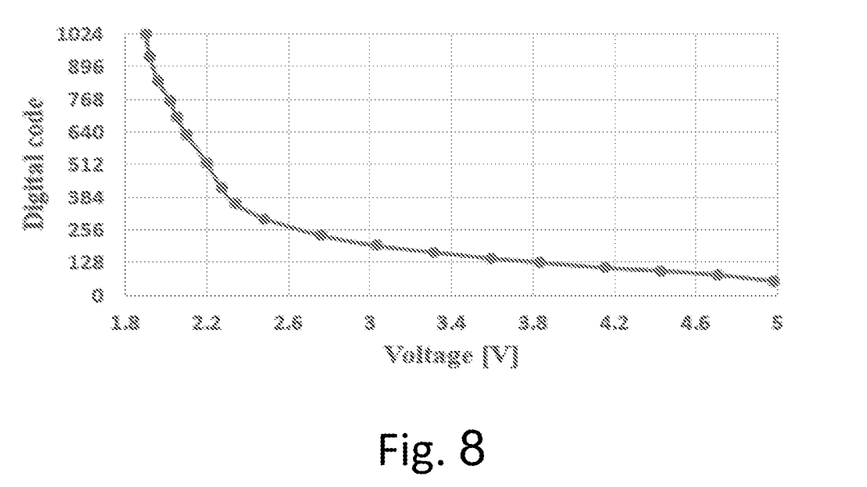
FIG. 8 schematically shows Static Conversion Characteristic of the implemented DL-ADC.

The ATC illustrated in FIG. 2 is realized by a standard one-shot timer with two inputs. One input connects to the NOR gate 201 (which is a digital cell) and is used to trigger a timed pulse, Vx. The second input receives the analog signal to be used as the bias-voltage for the R-C timing cell (which are the component in the one shot time cell). The pulse length at the output, which depends on the bias, produces a time representation of the analog signal. This R-C based timing mechanism can be expressed as:

$$T_{pulse} = RC \ln\left(\frac{V_{DD}}{V_{sample} - V_{threshold}}\right) \quad (1)$$

where $V_{DD}$ is the supply voltage of the digital cells (i.e. the logic gate in the one shot time cell), Vthreshold is the logic gate threshold voltage, and Vsample is the value of the sampled voltage at a sampling point 202. As can be observed from equation (1) and from FIG. 8, the conversion characteristics of the ATC are not linear. However, in many applications such as voltage regulators, the non-linear behavior of the one shot-timer has minor effect on the performance of the system since the operation centers around the operating point. For a general purpose ADC which requires linear behavior, division of the operating domain to linear segments or post conversion through look-up table comparison, can be applied to linearize the exponential behavior of the one-shot timing cell.

In the ATC, a start of count is the rising edge of said Vx pulse and stop of count is the falling edge of said Vx pulse.

The TDC performs the second step of the analog-to-digital conversion. The basic TDC module, which is schematically described in FIG. 3, consists of a delay line (DL) 301, latch register 302, translation block 303, and an output register 304. The DL is formed by a serially-connected buffer string. When initiated, the signal pulse Vx from the ATC module enters and propagates through the string at a rate which depends on each buffer's propagation delay. Once the pulse ends, i.e. the input returns to low, the DL momentarily holds the time information in raw thermometer code, assuming the complete input pulse duration is shorter than the string's cumulative propagation delay.

Figure 3:
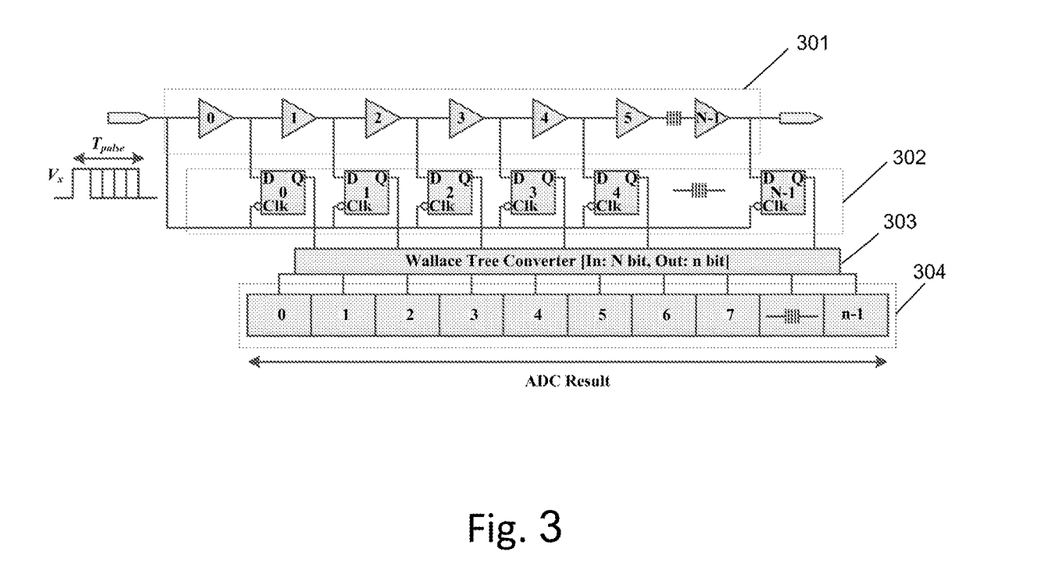
FIG. 3 schematically shows an High Architecture of the N-buffers string based DL-ADC according to an embodiment of the invention.

The number of the connected delay-cells in the string and the buffers propagation time determines the maximum width of the incoming signal Vx, and can be expressed as:

$$T_{pulse\_max} = t_{pd\_buffer} \times N \quad (2)$$

where $t_{pd\_buffer}$ is the propagation time of a single buffer and N is the number of the delay cells in the string.

In order to capture the raw thermometer code information, each cell of the DL branches out to a respective cell in a register of the same length as the DL. The register consists of D-FFs, which latch synchronously to the falling edge of the input pulse. In this manner the exacted thermometer value is captured, which linearly depends on the input pulse duration.

Figure 4:
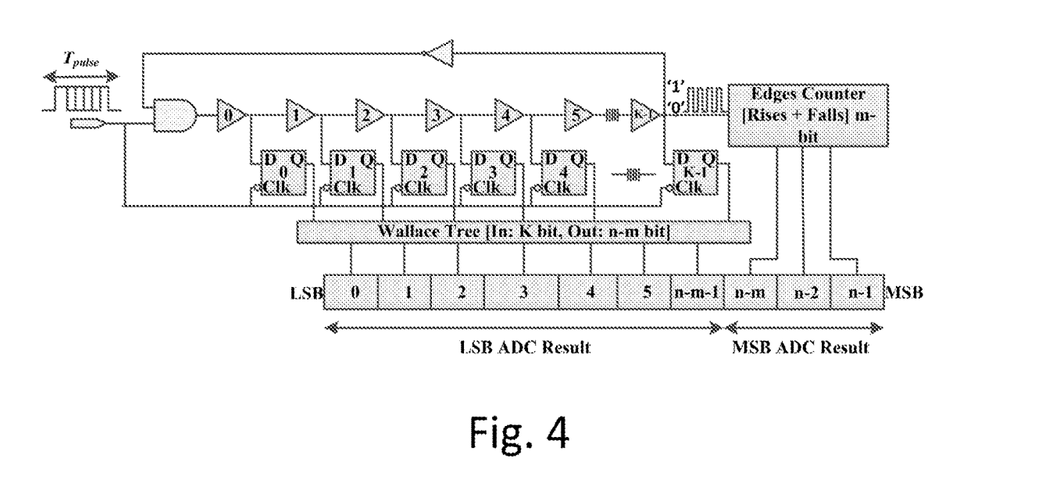
FIG. 4 schematically shows an High Architecture of the Ring Oscillator based DL-ADC.

The thermometer value is further translated to a readable binary value using a conversion block. The conversion can be realized in several methods such as a lookup table, arithmetic calculation, or a Wallace tree translation. The latter is adopted in the experiments of the present invention due to its high conversion time rate for high resolutions ADC converters and simple realization on IC. FIG. 4 shows the conversion procedure of the Wallace tree, based on a count process, according to an embodiment of the present invention. The number of ones in the captured thermometer code is quantified using hierarchically arranged full adder units which give a final result in binary form.

The desired output resolution determines the cell-count of each block of the TDC. An n-bit binary output register back-translates to an expanded $2^n$ bit thermometer code, hence the delay cell consists of $2^n$ buffer and D-FF cells. The relationship between the resolution and the number of delay cells in the string is given as follows:

$$N=2^n \quad (3)$$

It is noted that the ADC converter of the present invention implemented with the one shot time cell as the analog to time converter is a full digital converter without an analog part, yet, it receives an analog signal as an input.

The ADC of the present invention is fully digital and fully synthesizable from.

It can be deduced from equation (3) that realization of a high resolution DL-ADC, in this approach, increases the number of the delay elements and the register D-FFs units in an exponential form, doubling the required silicon area per additional bit which in higher accuracy ADC may become impractical for implementation. To overcome this area-demanding constraint, the TDC realization has been revisited.

Figure 5:
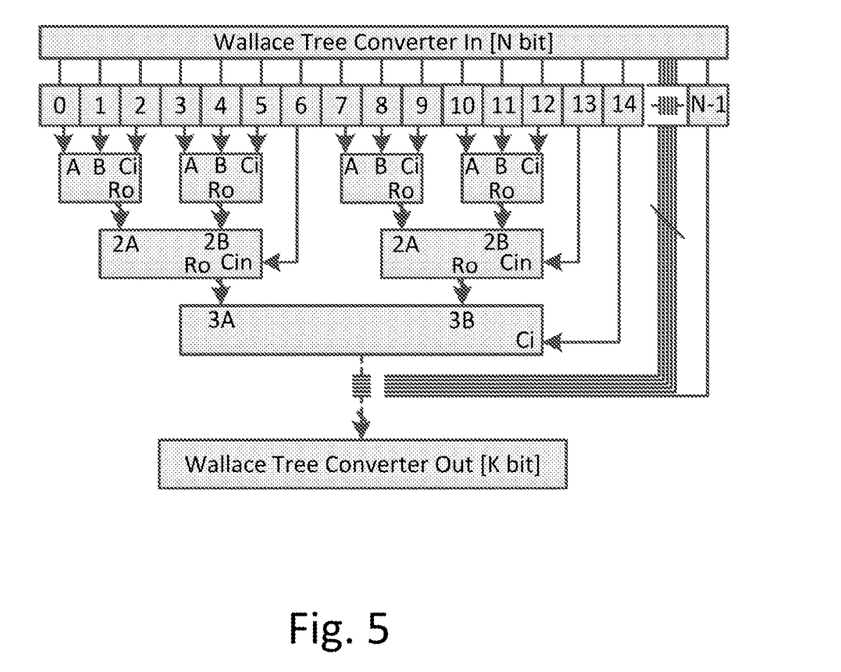
FIG. 5 schematically shows a Thermometer-to-Binary Converter based on Wallace Tree conversion.
Figure 6:
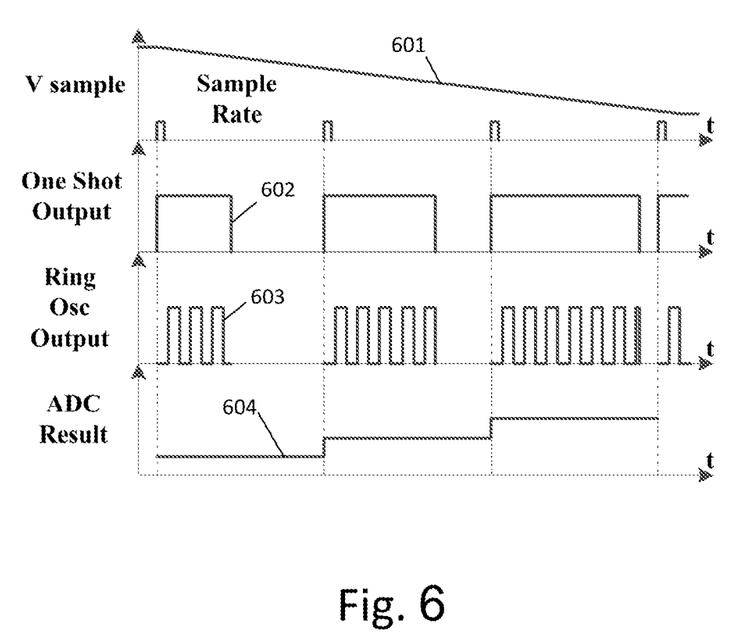
FIG. 6 schematically shows Functional behavior of the ring-oscillator based DL-ADC.

A modified TDC architecture is shown in FIG. 5, according to an embodiment of the invention. In this approach, the full delay line counter is replaced by a ring oscillator that feeds a synchronous counter. By doing so, the desired high resolution of the DL-ADC is independent on the string length. FIG. 6 schematically shows the conversion process, starting with the sampled signal $V_{sample}$ 601, then the incoming signal Vx, 602, to the ring oscillator, from the one-shot timer, triggers the ring oscillator and starts the conversion process. The output of the ring oscillator is signal 603 and the output of the ADC is signal 604. The LSBs of the output register are a direct Wallace-tree translation of the short delay-line. A counter, triggered both at rising and falling edges, is connected to the end of the ring-oscillator to count the repetition of full ring propagations, typically a constant time of TDL. The result is conjugated as the MSBs to the output register. For a counter with m bits, the maximum number of complete propagations that can be counted is 2m−1. Once Vx returns to low, the counter holds the amount of the times TDL fits within Tpulse, while the DL holds the residual time difference, with higher time resolution, due to the partial propagation of the last run.

Figure 7:
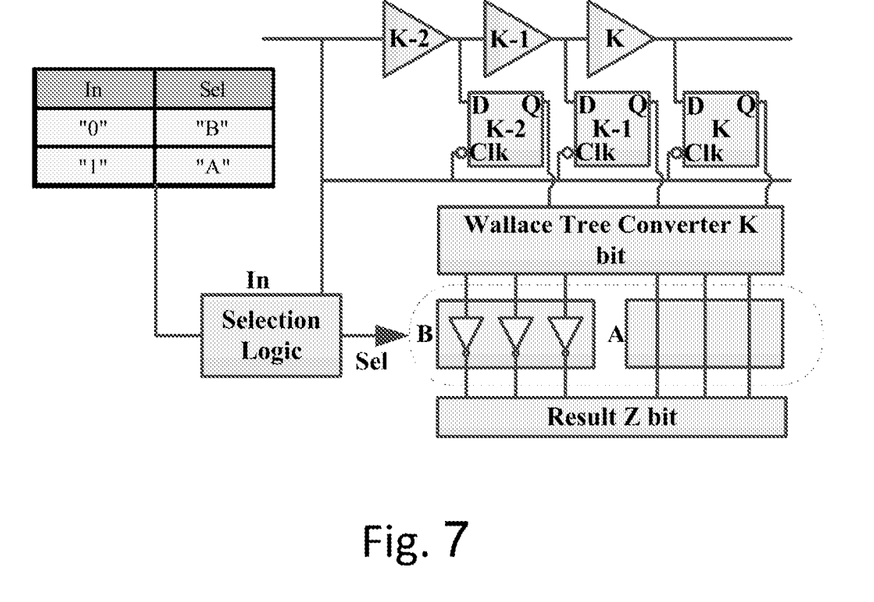
FIG. 7 schematically shows Logic components for the separation process

Since the LSBs are obtained out of the ring-oscillator value, in which each buffer output is inverted every full ring cycle, the resulting binary code branches after the Wallace-tree through NOT gates to invert the Wallace tree output when needed (FIG. 7). The inverting action is controlled by the first buffer input value.

The relationship between the resolution and the number of the delay cells in the string of the ring oscillator can be expressed as:

$$K=2^{n-m}, \quad n-m \geq 7 \quad (4)$$

where K is the number of the delay cells in the string, n is the desired resolution and m is the bits number of the edges counter.

Equations (3) and (4) indicate that for the same resolution of DL-ADC, the string length of the ring oscillator is much smaller than in the basic approach. As a result, the Wallace tree converter has a smaller number of input ports for evaluation of the thermometer-to-binary conversion and can be realized with significantly fewer logical elements, consequently reducing the effective silicon area of the design.

Figure 13:
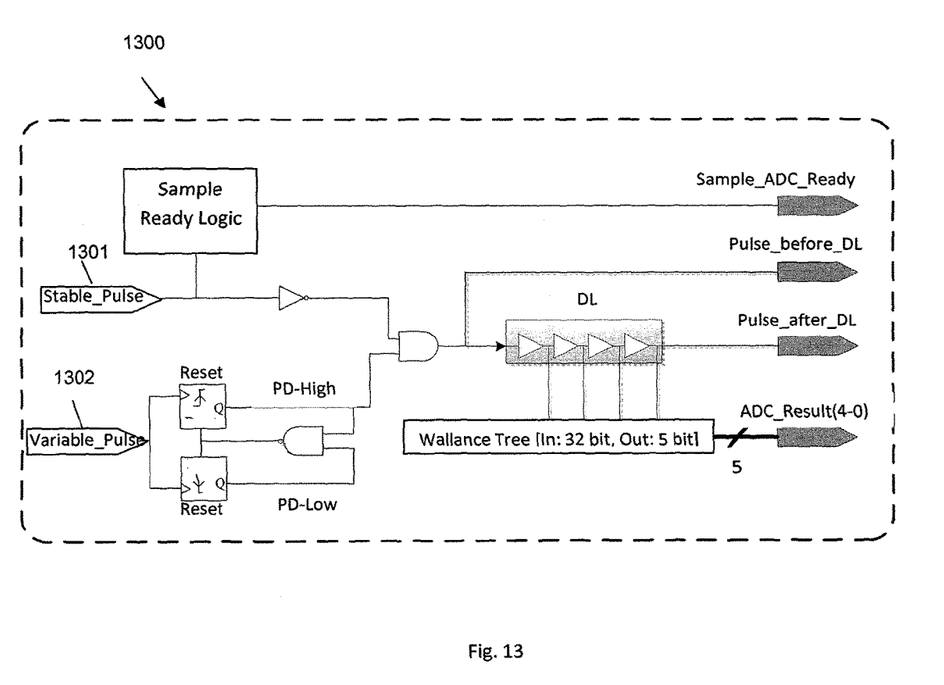
FIG. 13 schematically shows a window ADC according to an embodiment of the present invention.

In another embodiment the invention relates to a window-ADC operation, that is, measurement of the voltage difference is compared to a bias point. FIG. 13 schematically shows a window-ADC operation, wherein, the TDC 1300 (Time to Digital Converter) receives as an input two pulses. One reference pulse with constant duration 1301, and a second pulse 1302, with variable duration. The variable pulse is the output signal Vx of the one shot time cell of the Analog to Time converter. The duration of the variable pulse 1302 changes with respect to the sampled voltage in the one shot time cell of the Analog to Time converter. The reference pulse 1301 represents a bias point and can be generated either internally (for example: with a clock generator), or by an additional one-shot time cell with a constant Voltage at a sampling point. The variable pulse 1302 is the measurement pulse, generated by the one-shot time cell of the Analog to Time converter as described earlier.

The mechanism of the TDC of FIG. 13 is to obtain the time difference between the two pulses 1301 and 1302, and generate a time pulse Vt that is equivalent to this time difference. This is done by a logic operation (e.g. XOR, AND, etc.) between the variable pulse 1302 and the reference pulse 1301. Once the shorter pulse is obtained, the time count is obtained using a short delay-line counter as described above where the start count is the rising edge of the Vt pulse and the stop count is the falling edge of the Vt pulse.

The digital implementation of the DL-ADC into IC is done by developing digital logic design based only on vendor's standard digital components without any custom cells or complex analog circuits. The complete block diagram of the digitally implemented DL-ADC, shown in FIG. 9, includes four primary modules: the one-shot timer 901, DL counter 902, Wallace tree conversion unit 903, and a high architecture responsible for interconnection of all sub components 904.

The digital implementation is carried out through three main steps. First, the sub components and the high architecture are defined in hardware description language (e.g. VHDL) and are synthesized by vendor's standard-cell gates using synthesis and timing verification tools.

Next, digital and mixed-signal simulations are carried out using numerical simulation tools to verify the HDL translation. Finally, the layout is produced by automated CAD place and route (P&R) tools.

As an example of the process, two 10-bit DL-ADCs were implemented in TS18PM platform to verify the study. The produced DL-ADCs' layout are sized at 0.38 mm² of effective silicon area for the basic straightforward version, and 0.05 mm² for the ring oscillator based DL-ADC design approach, as shown in FIG. 9.

Figure 9:
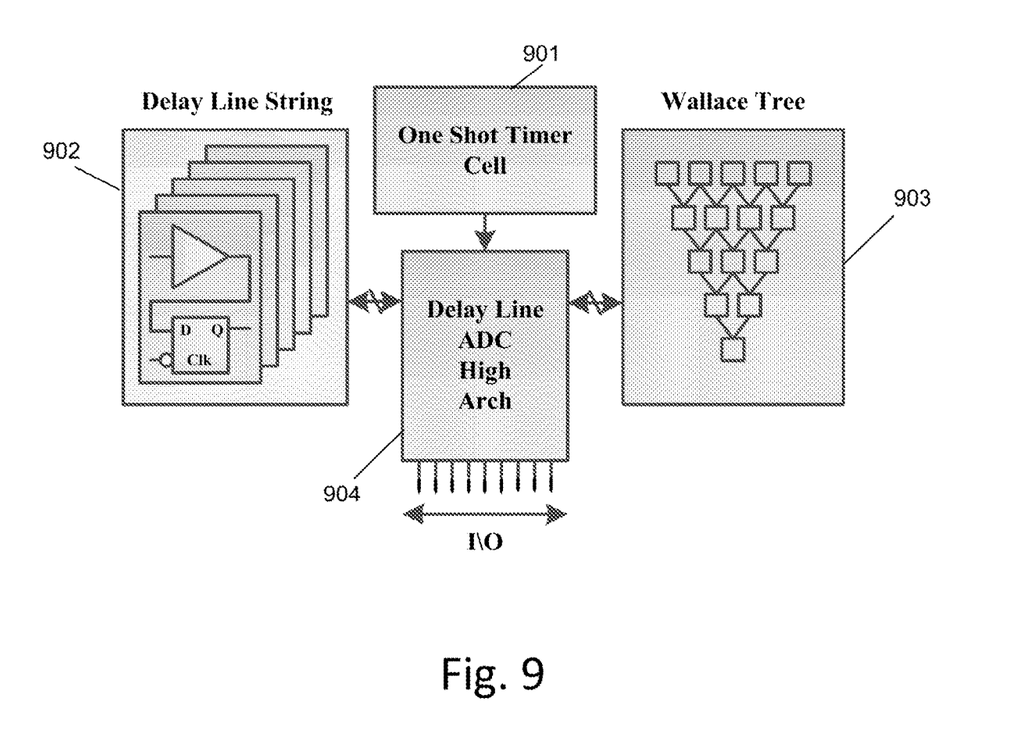
FIG. 9 schematically shows Block diagram of the DL-ADC High Architecture
Figure 11:
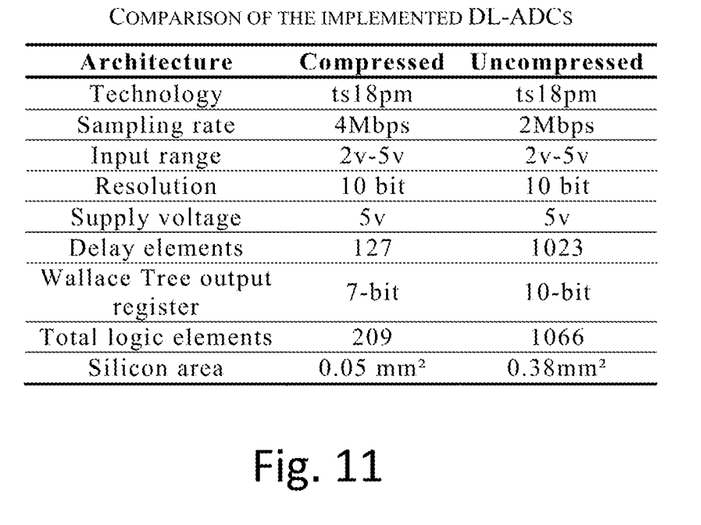
FIG. 11 schematically shows a comparison table of the implemented DL-ADCs.
Figure 12:
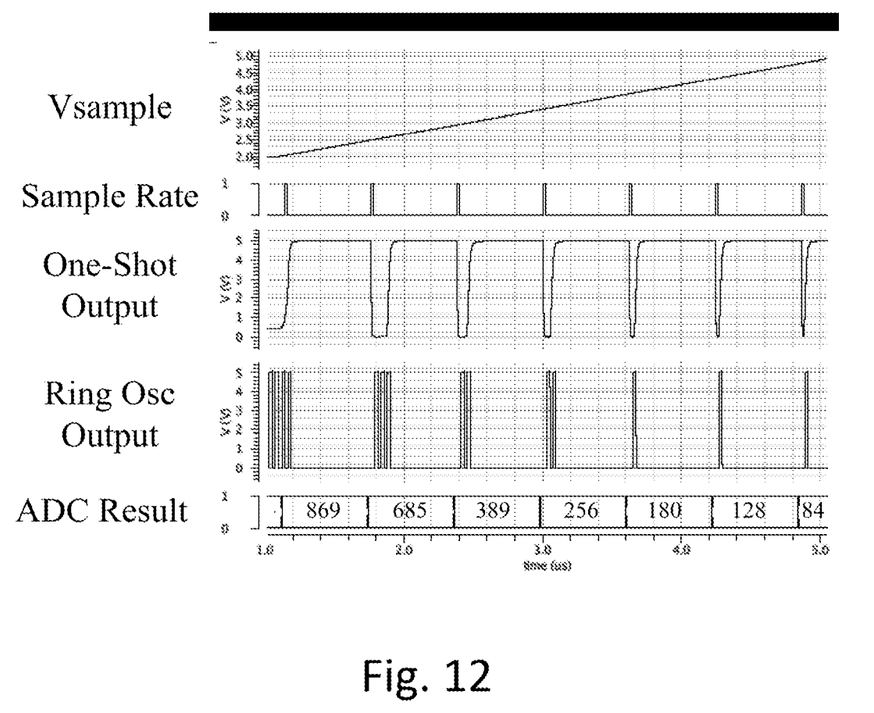
FIG. 12 schematically shows Post-layout Simulation Results of the implemented DL-ADC according to an embodiment of the invention.

Both ADCs shown in FIG. 9 were implemented by the same design procedure with key characteristics summarized in the Table presented in FIG. 11. To demonstrate the functionality of the implemented ring oscillator based 10-bit DL-ADC, post-layout simulations were performed with simple RC net components, where their values were calculated using equation (1).

Figure 10:
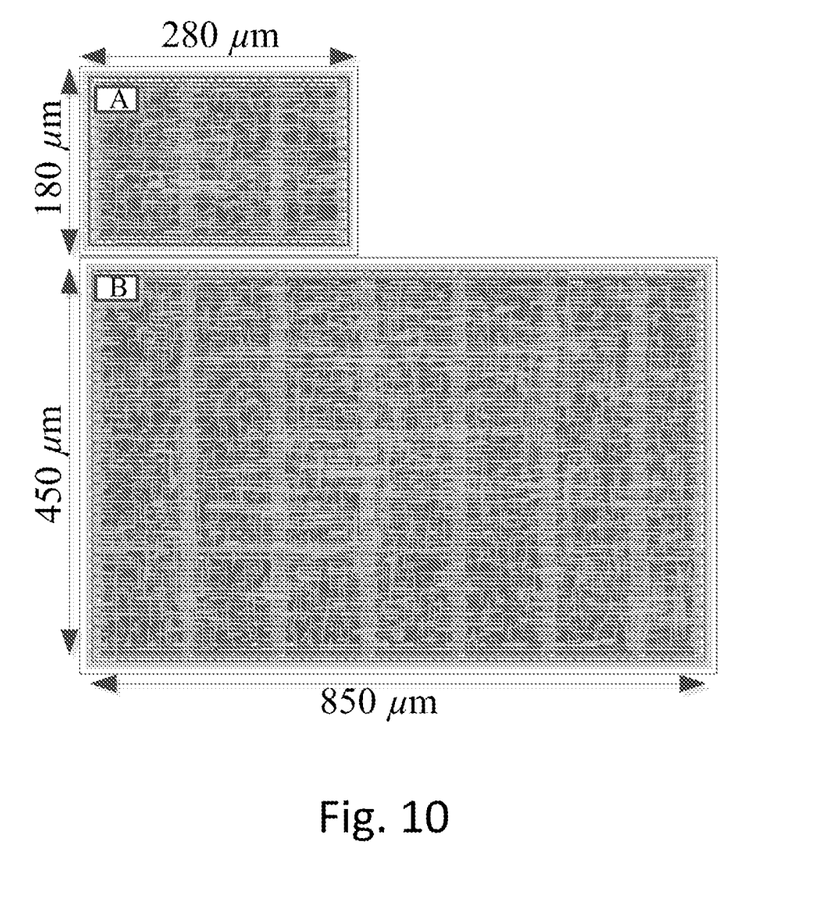
FIG. 10 schematically shows Layout of a Ring oscillator based DL-ADC verses basic 1023 Delay cells string based DL-ADC.

Post-layout simulation results as shown in FIG. 10, illustrate the DL-ADC behavior in transient mode, including the sampled voltage, sample rate, one-shot timer output, ring oscillator output, and the DL-ADC conversion result. The sampled voltage is a generated ramp signal, with a variable range between the threshold voltage and the supply voltage (high limit). It can be observed that, as the sampled voltage increases, the pulse width of the output signal from the one-shot timer narrows and as a result, there are less complete propagations through the ring. The DL-ADC result, normally represented as a binary word, is displayed in FIG. 10 as unsigned decimal value for readability, also in agreement with FIG. 8.

Static conversion characteristics of the implemented 10-bit ring oscillator based DL-ADC, as shown in FIG. 8, verify the DL-ADC functionality in overall range of Vthreshold to VDD. As a result of the R-C net components of the one-shot timer cell, the curve of the static conversion has exponential characteristics.

Figure 14:
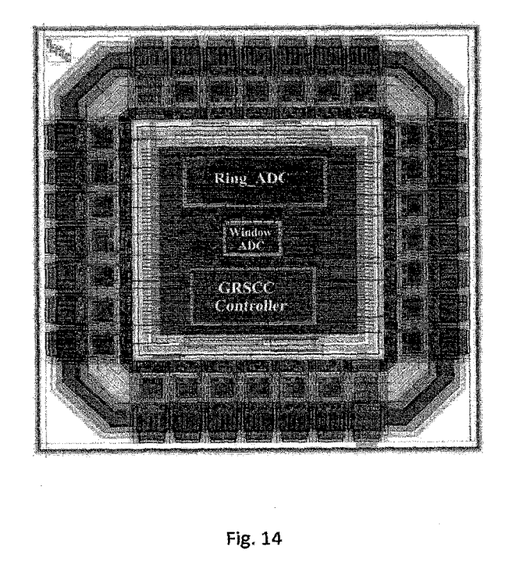
FIG. 14 schematically shows a Silicon chip realization of a ring ADC and window ADC with size comparison according to an embodiment of the present invention.

FIG. 14 depicts a tape-out photograph of realization in TS18 process by TowerJazz. It shows the resultant size for a 10-bit ring oscillator ADC as well as for a 5-bit window ADC. For scale, the total die size, including pads is 1.1 mm×1.1 mm.

The invention claimed is:

1. An analog to digital converter which comprises:
   a) an analog to time converter being a one shot time cell, which receives as an input a pulse trigger signal and outputs a pulse signal Vx, wherein the duration of Vx is proportional to the voltage levels and/or to the components in said one shot time cell, that determine the time response of said one shot time cell; and
   b) a time to digital converter, which receives said pulse signal Vx as an input and outputs a digital representation of the duration of said pulse signal Vx;
   wherein the one shot time cell consists of one input which connects to a NOR gate and is used to trigger a timed pulse signal Vx, and a second input which receives an analog signal to be used as a sampled voltage for an R-C timing cell, such that the outputted pulse duration, which depends on said sampled voltage, produces a time representation of said analog signal.

2. The analog to digital converter of claim 1, wherein $$T_{pulse} = RC \ln\left(\frac{V_{DD}}{V_{sample} - V_{threshold}}\right)$$

where $V_{DD}$ is the supply voltage of the digital cells in the one shot time cell, $V_{threshold}$ is the logic gate threshold voltage in the one shot time cell, and $V_{sample}$ is the value of the sampled voltage at a sampling point in the one shot time cell.

3. The analog to digital converter of claim 1, wherein the relationship between the sampled voltage and the digital output is linear by the addition of pre, or post conversion linearization unit.

4. The analog to digital converter of claim 1, wherein an analog link that connects to said sampled voltage is a resistor.

5. The analog to digital converter of claim 1, wherein a start of count is the rising edge of said Vx pulse and stop of count is the falling edge of said Vx pulse.

6. The analog to digital converter of claim 1, wherein a sampled voltage in a sample point, is generated with a sample-and-hold unit.

7. An analog to digital converter that operates as a window-ADC which comprises:
   a) an analog to time converter being a one shot time cell, which receives as an input a pulse trigger signal and outputs a pulse signal, the duration of which is proportional to the voltage levels and/or to the components in said one shot time cell, that determine the time response of said one shot time cell;
   b) a time to digital converter, which receives as an input:
      (i) said output pulse signal as a variable signal; and
      (ii) a constant reference signal;
and comprises a logic component for performing a logic operation between said variable signal, and said constant reference signal, to generate a resulting time representation pulse Vt with a duration which equals the time difference between said constant reference signal and said variable signal; and
   wherein said time to digital converter outputs a digital signal that represents said duration.

8. The analog to digital converter of claim 7, wherein said reference signal is internally generated.

9. The analog to digital converter of claim 7, wherein the reference signal is generated by an additional one-shot timer with a constant Voltage at a sampling point.

10. The analog to digital converter of claim 7, wherein a start of count is the rising edge of the said Vt pulse and stop of count is the falling edge of said Vt pulse.

* * * * *